United States Patent
Lee

(10) Patent No.: US 9,524,984 B1
(45) Date of Patent: Dec. 20, 2016

(54) 3D SEMICONDUCTOR DEVICE WITH ENHANCED PERFORMANCE

(71) Applicant: SK hynix Inc., Icheon-si Gyeonggi-do (KR)

(72) Inventor: Hee Youl Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/989,355

(22) Filed: Jan. 6, 2016

(30) Foreign Application Priority Data

Aug. 24, 2015 (KR) .................. 10-2015-0119091

(51) Int. Cl.
*H01L 27/115* (2006.01)

(52) U.S. Cl.
CPC ... *H01L 27/11582* (2013.01); *H01L 27/11568* (2013.01)

(58) Field of Classification Search
CPC .................... H01L 27/11578; H01L 27/11582; H01L 27/11551; H01L 27/11556; H01L 27/11568
See application file for complete search history.

(56) References Cited

U.S. PATENT DOCUMENTS 8,377,817 B2 * 2/2013 Park .................. H01L 27/11551
257/E21.677

FOREIGN PATENT DOCUMENTS

| KR | 1020080036434 A | 4/2008 |
| KR | 1020130032502 A | 4/2013 |

OTHER PUBLICATIONS

KR10-20080036434—Englsih Translation.*

* cited by examiner

*Primary Examiner* — Jose R Diaz
(74) *Attorney, Agent, or Firm* — William Park & Associates Ltd.

(57) ABSTRACT

The present disclosure may provide a semiconductor device with a low manufacturing degree of difficulty and an enhanced performance. The device may include conductive layers and insulating layers, alternately stacked, each of the insulating layers being thinner than each of the conductive layers; a channel layer passing through the conductive layers and the insulating layers; a data storage layer surrounding a side-wall of the channel layer; and first charge blocking patterns, each of the first charge blocking patterns interposed between the conductive layers and the insulating layers and between the data storage layer and the conductive layers.

9 Claims, 9 Drawing Sheets

3D SEMICONDUCTOR DEVICE WITH ENHANCED PERFORMANCE

CROSS-REFERENCE TO RELATED APPLICATION

The present application claims priority under 35 U.S.C §119(a) to Korean patent application number 10-2015-0119091 filed on Aug. 24, 2015, in the Korean Intellectual Property Office, the entire disclosure of which is incorporated by reference herein.

BACKGROUND

1. Technical Field

The present disclosure relates to a semiconductor device and a method of manufacturing the same, and, in particular, a semiconductor device including a three-dimensional memory device and a method of manufacturing the same.

2. Related Art

A non-volatile memory device may maintain already-stored data in a power-off state thereof. As a 2D memory device with a single layer memory cell on a silicon substrate reaches a maximum degree of integration, there has recently been proposed a 3-dimensional non-volatile memory device having vertical memory cells stacked from and on a silicon substrate.

The 3D non-volatile memory device includes a stack of vertical alternations of conductive layers and insulating layers, and a vertical channel layer passes through the conductive layers and insulating layers. Further, a charge trapping layer may surround the vertical channel layer so as to store data. However, the charge trapping layers of stacked memory cells may have interconnections, and, hence, charges may travel between the memory cells. This may lead to stored data damages. Further, the vertical channel layer may be thinner and hence may not achieve sufficient cell current. Further, a breakdown voltage may possibly not be established between adjacent gate electrodes. Thus, those gate electrodes having a voltage breakdown may result in a performance degradation of the memory device.

SUMMARY

The present disclosure may provide a semiconductor device with a low manufacturing degree of difficulty and an enhanced performance, and also a method of manufacturing the same.

In one aspect of the present disclosure, there is provided a semiconductor device comprising: conductive layers and insulating layers, alternately stacked, each of the insulating layers is thinner than each of the conductive layers; a channel layer passing through the conductive layers and the insulating layers; a data storage layer surrounding a sidewall of the channel layer; and first charge blocking patterns, each of the first charge blocking patterns interposed between the conductive layers and the insulating layers and interposed between the data storage layer and the conductive layers.

In one aspect of the present disclosure, there is provided a method of manufacturing a semiconductor device, comprising: alternately forming first material layers and second material layers; forming a first opening passing through the first material layers and the second material layers; forming a data storage layer in the first opening; forming second openings by removing the first material layers; forming a first silicon source layer on the data storage layer and the second material layers through the second openings; and forming a first charge blocking layer by oxidizing the first silicon source layer.

In one aspect of the present disclosure, there is provided a method of manufacturing a semiconductor device, comprising: alternately forming first material layers and second material layers; forming a first opening passing through the first material layers and the second material layers; forming a silicon source layer in the first opening; forming a data storage layer in the silicon source layer; forming second openings by removing the first material layers; and forming charge blocking patterns by oxidizing the silicon source layer exposed through the second openings.

In the present disclosure, the oxidation of the silicon source layer may result in the charge blocking layer. Since in the oxidation, the silicon source layer may supply the silicon source, an oxidation of the data storage layer may be suppressed or minimized. In this approach, the data storage layer may have a reduced thickness, and, hence, charge mobility between the stacked memory cells may be reduced. This may lead to improved data retention.

Further, due to the reduced data storage layer thickness, there may occur an accordingly-increasing channel layer thickness. This may lead to increased cell currents of the stacked memory cells.

Furthermore, the insulating layers thickness may be added or supplemented by oxidizing the silicon source layer formed on the insulating layers. This may lead to a breakdown voltage establishment between the stacked gate electrodes.

BRIEF DESCRIPTION OF THE DRAWINGS

A brief description of each drawing is provided to more fully understand the drawings, which is incorporated in the detailed description of the disclosure.

DETAILED DESCRIPTIONS

Figure 1:
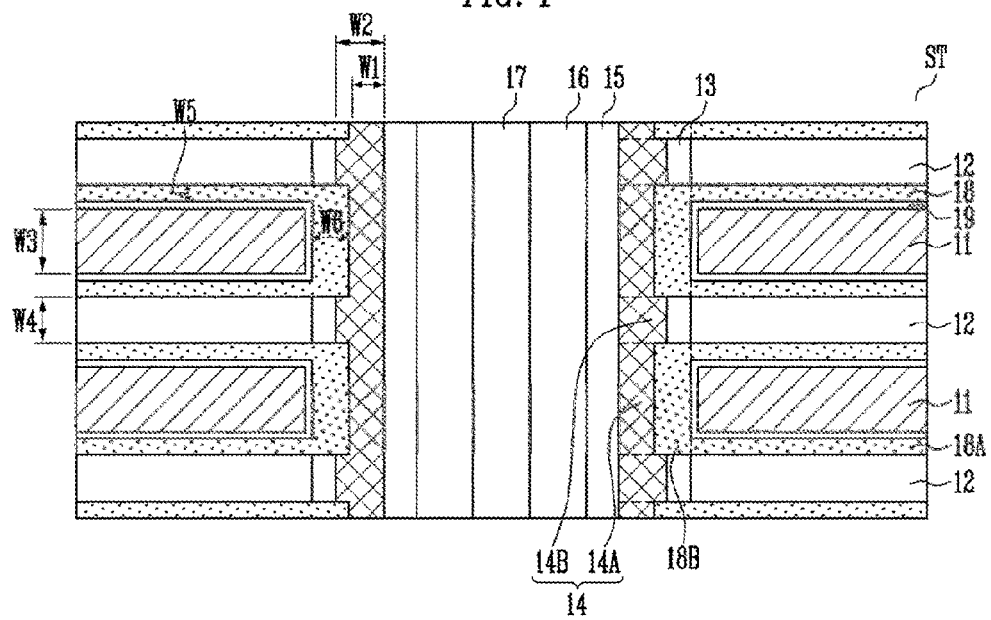
FIG. 1 is a cross-sectional view illustrating a semiconductor device according to one implementation of the present disclosure, and, in particular, is a cross-sectional view illustrating of a memory string.

Examples of various embodiments are illustrated in the accompanying drawings and described further below. It will be understood that the discussion herein is not intended to limit the claims to the specific embodiments described. On the contrary, it is intended to cover alternatives, modifications, and equivalents as may be included within the spirit and scope of the present disclosure as defined by the appended claims.

Example embodiments will be described in more detail with reference to the accompanying drawings. The present disclosure, however, may be embodied in various different forms, and should not be construed as being limited to only the embodiments illustrated herein. Rather, these embodiments are provided as examples so that this disclosure will be thorough and complete, and will fully convey the aspects and features of the present disclosure to those skilled in the art.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, the element or layer can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in detail with reference to attached drawings.

FIG. 1 is a cross-sectional view illustrating a semiconductor device according to one implementation of the present disclosure, and, in particular, is a cross-sectional view illustrating of a memory string.

Referring to FIG. 1, the semiconductor device according to one implementation of the present disclosure may include a stack ST of conductive layers 11 and insulating layers 12, alternately stacked. Further, the stack ST may include sacrificial patterns 13, a data storage layer 14, a tunnel insulating layer 15, a channel layer 16, a gap-fill insulating layer 17, first charge blocking patterns 18 and second charge blocking patterns 19.

The channel layer 16 may act as a channel layer for memory cells or select transistors of the memory string. In one example, the channel layer 16 may be made of a semiconductor material such as silicon (Si), germanium (Ge) or the like. Further, the channel layer 16 may be non-hollow or hollow. In the hollow structure, a gap-fill insulating layer 17 may fill the hollow portion.

Although only a portion of the channel layer 16 is illustrated in the figure, the channel layer 16 may have a liner shape extending from a substrate (not shown) or a U-shape over the substrate (not shown). That is, the memory string may extend vertically from the surface of the substrate or may extend in the U shape over the substrate.

The channel layer 16 may have a side-wall surrounded with the tunnel insulating layer 15 and the data storage layer 14. In one example, the tunnel insulating layer 15 may surround the side-wall of the channel layer 16, and the data storage layer 14 may surround a side-wall of the tunnel insulating layer 15. The tunnel insulating layer 15 may be made of an oxide. The data storage layer 14 may be made of silicon, nitride, nano-dots, phase-transform material or the like.

The data storage layer 14 may include first portions 14A contacting the first charge blocking patterns 18 and second portions 14B respectively between the first portions 14A. The first portions 14A and the second portions 14B may be alternated respectively. The first portions 14A may act as a memory cell region, while the second portions 14B may act as a gap region between stacked and spaced memory cells. Further, the data storage layer 14 may include each of the first portions 14A and each of the second portions 14B having a same thickness (W1=W2) or having different thicknesses (W1<W2 or W1>W2). It may be understood that although each of the first portions 14A has a thickness W1 less than the thickness W2 of each of the second portions 14B in this figure, the data storage layer 14 may have an uneven outer face.

Further, the data storage layer 14 may be made of a single layer or multi-layers. In the latter case, the multiple layers may include a plurality of nitride layers having different silicon contents. In one example, the plurality of the layers may be arranged such that the silicon content thereof may be in an inverse proportional relationship to a closeness plurality of layers to the tunnel insulating layer 15 and in a proportional relationship to closeness of the plurality of layers to the first charge blocking pattern 18.

The conductive layers 11 may act as a gate electrode for the memory cell or select transistor of the memory string. In one example, the conductive layers 11 may be made of a conductive material such as a tungsten W, tungsten nitride $WN_x$ or the like. The conductive layers 11 may be stacked and surrounding a side-wall of the channel layer 16. Disposed between the conductive layers 11 and the channel layer 16 may be the tunnel insulating layer 15, the data storage layer 14, the first charge blocking pattern 18 and the second charge blocking pattern 19.

The insulating layers 12 may act to inter-insulate the stacked gate electrodes and may include an oxide. The insulating layers 12 may be stacked and surround a side-wall of the channel layer 16. The insulating layers 12 each may be disposed between the adjacent conductive layers 11. Disposed between the insulating layers 12 and the channel layer 16 may be the tunnel insulating layer 15, data storage layer 14 and sacrificial pattern 13. The channel layer 16 may pass through the conductive layers 11 and the insulating layers 12. Further, each of the insulating layers 12 may be thinner than each of the conductive layers 11 (W4<W3).

Each of the first charge blocking patterns 18 may be configured to surround each of the conductive layers 11 except for a portion of the conductive layer 11 facing away from the data storage layer 14. The first charge blocking patterns 18 may be made of an oxide, and may be made by an oxidation of a silicon source layer. Further, each of the first charge blocking patterns 18 may be disposed between each of the conductive layers 11 and each of the insulating layers 12, and between each of the conductive layers 11 and the data storage layer 14. In this way, each of the first charge blocking patterns 18 may have a "C" shape. In this connection, each of the first charge blocking patterns 18 may have a horizontal-extending first portion 18A between each of the conductive layers 11 and each of the insulating layers 12, and a vertical-extending second portion 18B between each of the conductive layers 11 and the data storage layer 14, wherein the horizontal portion may have a thickness W5 less than a thickness W6 of the vertical portion.

Each of the sacrificial patterns 13 may be formed in a ring shape so as to surround each of the second portions 14B of the data storage layer 14, and may be disposed between each of the second portions 14B of the data storage layer 14 and each of the insulating layers 12. The sacrificial patterns 13 may be made of an oxide.

The second charge blocking patterns 19 each may be further formed so as to surround each of the conductive layers 11 except a portion of the conductive layers 11 opposite to the data storage layer 14. In one example, each of the second charge blocking patterns 19 may be disposed between each of the conductive layers 11 and each of the first charge blocking patterns 18. This may also lead to a C shape thereof. In one example, the second charge blocking patterns 19 may be made of a high-K dielectric material such as an $Al_2O_3$ or the like.

In one example, the first charge blocking patterns 18 may be made by an oxidation, while the second charge blocking patterns 19 may be made by a vapor-deposition. Thus, each of the memory cells may include both the first charge blocking pattern 18 made by the oxidation and the second charge blocking pattern 19 made by the vapor-deposition.

Although not illustrated in this figure, between each of the conductive layers 11 and each of the second charge blocking patterns 19, there may also be disposed a the barrier layer which surrounds each of the conductive layers 11. In one example, the barrier layers may be made of a titanium Ti, a tantalum Ta, a titanium nitride TiN, a tantalum nitride TaN or the like.

According to the above structure of the memory device, a sufficient thickness of each first charge blocking patterns 18 may be acquired between the data storage layer 14 and each of the conductive layers 11. This may lead to improved data retention of the memory cell.

FIG. 2A to FIG. 2E are respectively cross-sectional views illustrating a method of manufacturing the semiconductor device according to one implementation of the present disclosure. Hereinafter, overlapping portions of descriptions for this embodiment with the previous descriptions may be omitted.

Figure 2A:
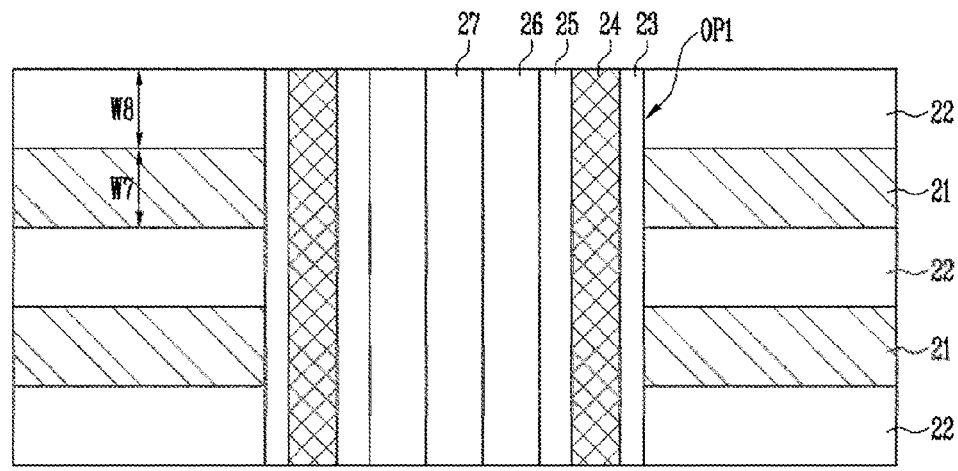
FIG. 2A to FIG. 2E are respectively cross-sectional views illustrating a method of manufacturing a semiconductor device according to one implementation of the present disclosure.

Referring to FIG. 2A, first material layers 21 and second material layers 22 may be alternately formed. The first material layers 21 may have a high etch selectivity with respect to the second material layers 22. In one example, the first material layers 21 may be formed of a sacrificial layer including a nitride, while the second material layers 22 may be formed of an insulating layer including an oxide. The first material layers 21 and second material layers 22 may have substantially the same thickness W7=W8. In this instance, the term "substantially" may refer to an inclusion of a tolerance range related to a manufacturing process.

Thereafter, a first opening OP1 passing through the first and second material layers 21, 22 may be formed. A sacrificial layer 23, data storage layer 24, tunnel insulating layer 25, channel layer 26 and gap-fill insulating layer 27 may be sequentially formed in the first opening OP1. The sacrificial layer 23 may act to prevent the data storage layer 24 from damage in a subsequent second opening formation, and, may be made of an oxide material.

Figure 2B:
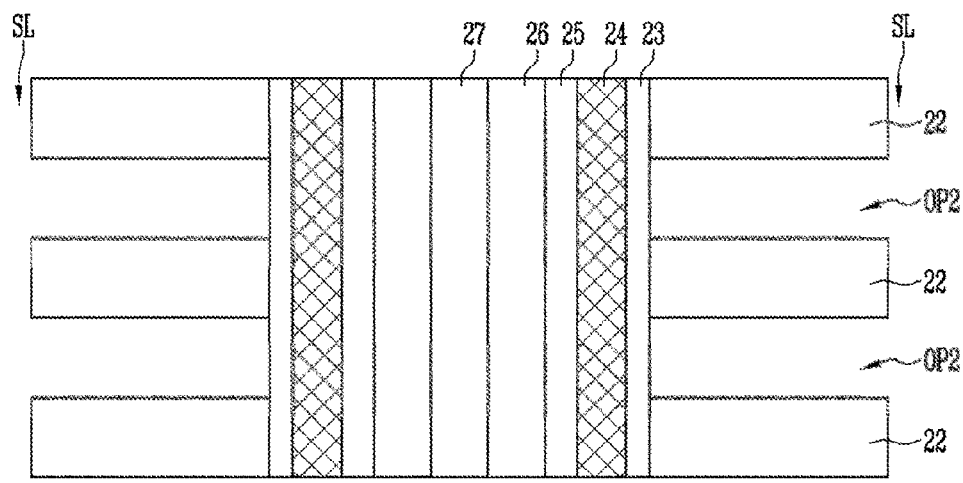

Referring to FIG. 2B, second openings OP2 may be formed by removing the first material layers 21, selectively. In one example, a slit SL passing through the first and second material layers 21, 22 may be formed, and the first material layers 21 may be removed through the slit SL. Upon the removal of the first material layers 21, the sacrificial layer 23 may be exposed in an intermittent manner through the second openings OP2. Further, in the course of the removal of the first material layers 21, the sacrificial layer 23 may protect the data storage layer 24 from the removal.

Figure 2C:
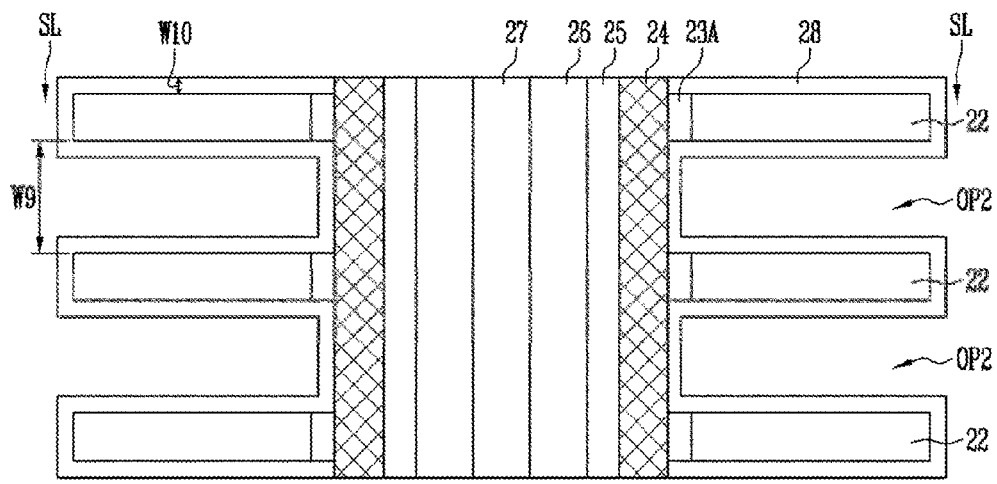

Referring to FIG. 2C, through the second openings OP2, the sacrificial layer 23 may be at least partially removed to form the sacrificial patterns 23A. During the removal of the sacrificial layer 23, through the second openings OP2, a thickness of the second material layers 22 may be partially removed. In this way, the second openings OP2 may have an increased width W9.

After this, the second openings OP2 may be filled with a silicon source layer 28. In one example, through the second openings OP2, the silicon source layer 28 may be formed on the second material layers 22 and data storage layer 24. The silicon source layer 28 may have a uniform thickness while not completely filling the second openings OP2.

The silicon source layer 28 may act to supply silicon therefrom in an subsequent oxidation to form a first charge blocking layer. For this, the silicon source layer 28 may include silicon. Further, the silicon source layer 28 may have a higher silicon content than the data storage layer 24. In one example, the silicon source layer 28 may include a polysilicon, amorphous silicon, Si-rich nitride, N-rich nitride or stoichiometric nitride.

Further, the silicon source layer 28 may have a thickness W10 thinner than a thickness W11 of a target first charge blocking layer. In one example, the silicon source layer 28 may have the thickness W10 ½ times thinner than the thickness W11 of a target first charge blocking layer.

Figure 2D:
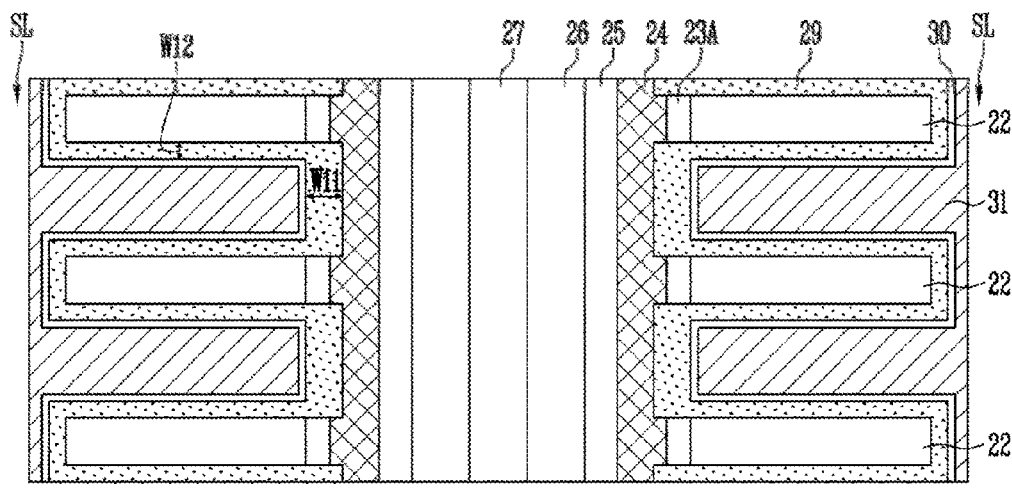

Referring to FIG. 2D, a first charge blocking layer 29 may be formed by oxidizing the silicon source layer 28. In one example, the silicon source layer 28 may be oxidized by a heat oxidation process and the silicon (Si) included in the silicon source layer 28 may be used as a source. When the silicon source layer 28 does not supply a sufficient silicon source, silicon (Si) included in the data storage layer 24 may be used as the silicon source. In this case, the data storage layer 24 portion contacting the silicon source layer 28 may be oxidized, resulting in an uneven outer face of the data storage layer 24. In one example, the data storage layer 24 portion contacting the silicon source layer 28 may have a reduced thickness.

The first charge blocking layer 29 may include vertical portions contacting the data storage layer 24 and horizontal portions contacting the insulating layer 22. The vertical portions and horizontal portions may have substantially the same thickness, or may have different thicknesses. In one example, the vertical portion may have a thickness W11 larger than a thickness W12 of the horizontal portion.

Next, in the second opening OP2 and on the first charge blocking layer 29, a second charge blocking layer 30 may be formed. In this connection, the second charge blocking layer 30 may have a thickness so as not to completely fill the second openings OP2 and may be conformally formed on the first charge blocking layer 29. In one example, a vapor-deposition such as an atomic layer deposition (ALD) may be used to form the second charge blocking layer 30. Further, the second charge blocking layer 30 may be made of a high K dielectric material, which may be, in one example, an oxide $Al_2O_3$.

The second charge blocking layer 30 may be omitted; or barrier patterns may be additionally formed on the second charge blocking layer 30; or the second charge blocking layer 30 may be replaced with the barrier patterns. The barrier layer may include a titanium Ti, tantalum Ta, titanium nitride TiN, tantalum nitride TaN, or the like.

In turn, the remaining second openings OP2 may be fully filled with conductive layer 31. The conductive layer 31 may include a metal such as a tungsten W, tungsten nitride $WN_x$ or the like. In one example, the conductive layer 31 may be formed using a vapor-deposition. In this case, the conductive layer 31 may be formed in the slit SL. In one example, a seed layer having a nucleation site may be formed on the second charge blocking layer 30, and the conductive layer 31 may be formed from the seed layer. In this case, conductive patterns 31A may be formed only in the second openings OP2.

Figure 2E:
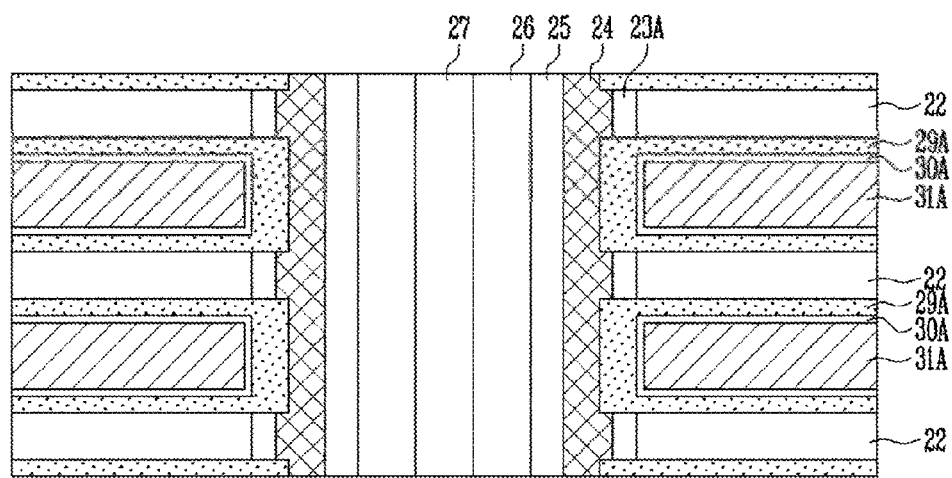

Referring to FIG. 2E, the first charge blocking patterns 29A, second charge blocking patterns 30A and conductive patterns 31A may be formed by removing the first charge blocking layer 29, second charge blocking layer 30 and conductive layer 31 formed in the slit SL.

In this way, the stacked memory cells may be formed. Each of the memory cells may include the channel layer 26, the tunnel insulating layer 25 surrounding the channel layer 26, the data storage layer 24, the first charge blocking pattern 29A and second charge blocking pattern 30A, and conductive pattern 31A.

According to the above-addressed process approach, due to the supply of the silicon source from the silicon source layer 28 in the oxidation process, the data storage layer 24 may have a reduced oxidized thickness. Therefore, the data storage layer 24 may have a reduced thickness in the first opening OP1, and, accordingly, the channel layer 26 may have an increased thickness. That is, without increasing the first opening OP1 width, the channel layer 26 may be thicker, leading to an increased cell current. Further, as the thickness of the data storage layer 24 is reduced, charge mobility between the stacked memory cells may be reduced.

Further, although along with etching the sacrificial layer 23 to form the sacrificial patterns 23A, the insulating layers 22 may be also etched to be thinner, the reduced thickness may be supplemented with the horizontal portion of the first charge blocking patterns 29A. In other words, the vertical portion of the first charge blocking layer pattern 29A between the conductive pattern 31A and the data storage layer 24 may function as a substantial charge blocking layer, whereas the horizontal portion of the first charge blocking pattern 29A between the insulating layer 22 and the conductive pattern 31A may act to supplement the reduction of the thickness of the insulating layer 22. In this way, a narrowing of the space between the stacked conductive patterns 31A may be prevented. This may result in a breakdown voltage establishment between the stacked gate electrodes.

Figure 3A:
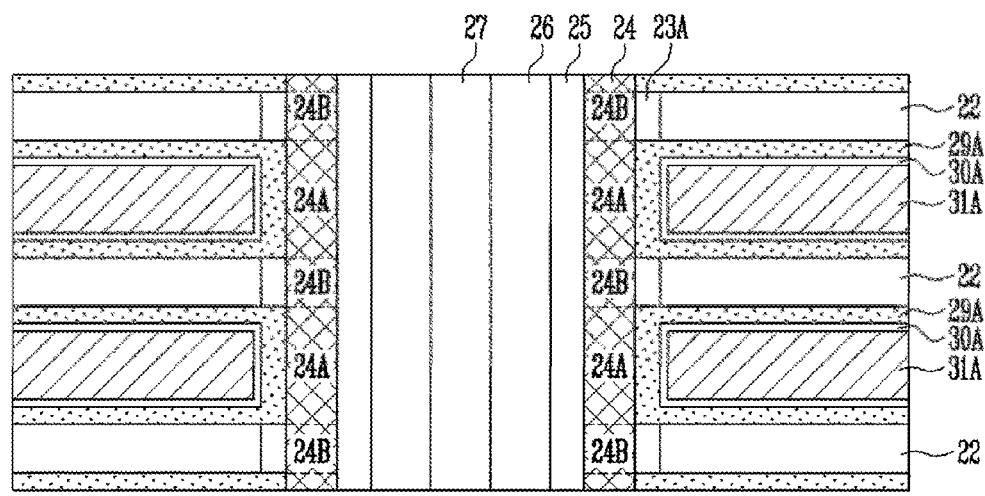
FIG. 3A and FIG. 3B are respectively cross-sectional views illustrating a configuration of and a method of manufacturing a semiconductor device according to one implementation of the present disclosure.
Figure 3B:
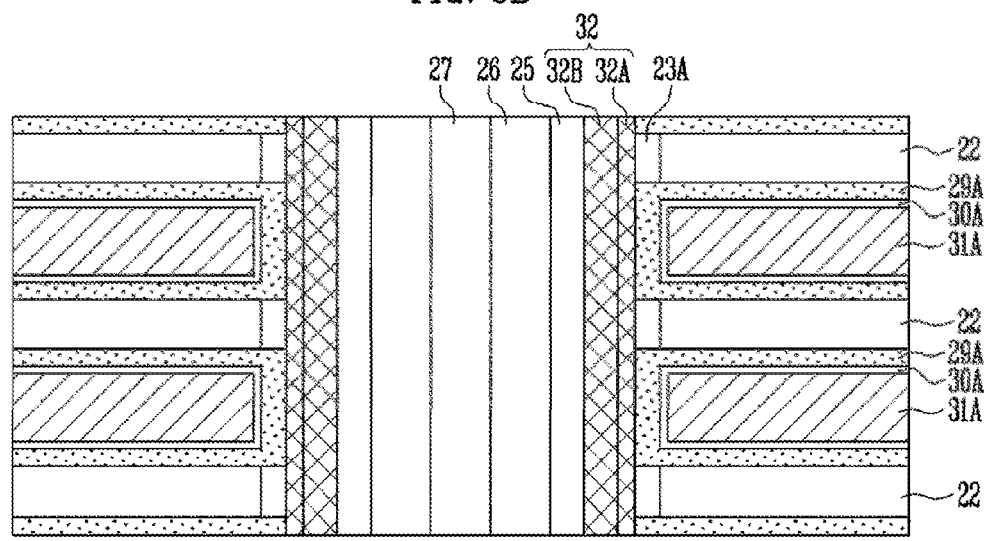

FIG. 3A and FIG. 3B are respectively cross-sectional views illustrating a configuration of and a method of manufacturing the semiconductor device according to one implementation of the present disclosure. In this embodiment, a data storage layer has a uniform thickness along the vertical direction. Hereinafter, overlapping portions of descriptions for this embodiment with the previous descriptions may be omitted.

Referring to FIG. 3A, a data storage layer 24 may include spaced first portions 24A contacting respectively first charge blocking patterns 29A and spaced second portions 24B contacting respectively sacrificial patterns 23A. For these contacts, the first portions 24A may have substantially the same thickness as a thickness of the second portions 24B. The remainder of the configuration, except disclosed thicknesses, may be identical with those in FIG. 2E.

As mentioned above, a thickness of the data storage layer 24 may change in the oxidation process to form the first charge blocking patterns 29A. In this embodiment, oxidation may proceed using the silicon source from the silicon source layer. In this example, the large thickness of the silicon source layer may provide a sufficient amount of the silicon source, while the thinness of the silicon source layer may provide an insufficient amount of silicon source. In the latter case, silicon from the data storage layer 24 may be used as the silicon source. In this way, the data storage layer 24 may be partially oxidized.

Therefore, in this embodiment, the silicon source layer 28 is formed with a sufficient thickness, so that the silicon source from the silicon source layer 28 may be sufficiently supplied in the oxidation. Thus, in the oxidation, the data storage layer 24 may possibly not be oxidized and hence the data storage layer 24 may have a uniform thickness.

Referring to FIG. 3B, the data storage layer 32 may be implemented in multiple layers. The data storage layer 32 may include a first data storage layer 32A surrounding the side-wall of the channel layer 26, and a second data storage layer 32B between the first data storage layer 32A and the channel layer 26. In this connection, the first data storage layer 32A may be made of a first nitride layer including silicon, and the second data storage layer 32B may be made of a second nitride layer including silicon. Further, the first nitride layer may have a higher silicon content than the second nitride layer. The first nitride layer may be thinner than the second nitride layer. A partially oxidized thickness of the first data storage layer 32A may result in an uneven outer surface thereof as in FIG. 2E.

Figure 4A:
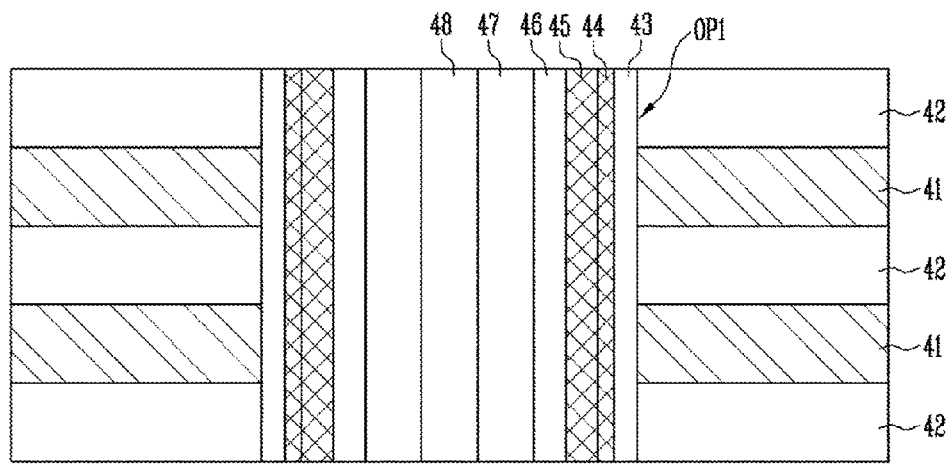
FIG. 4A to FIG. 4C are respectively cross-sectional views illustrating a method of manufacturing a semiconductor device according to one implementation of the present disclosure.
Figure 4B:
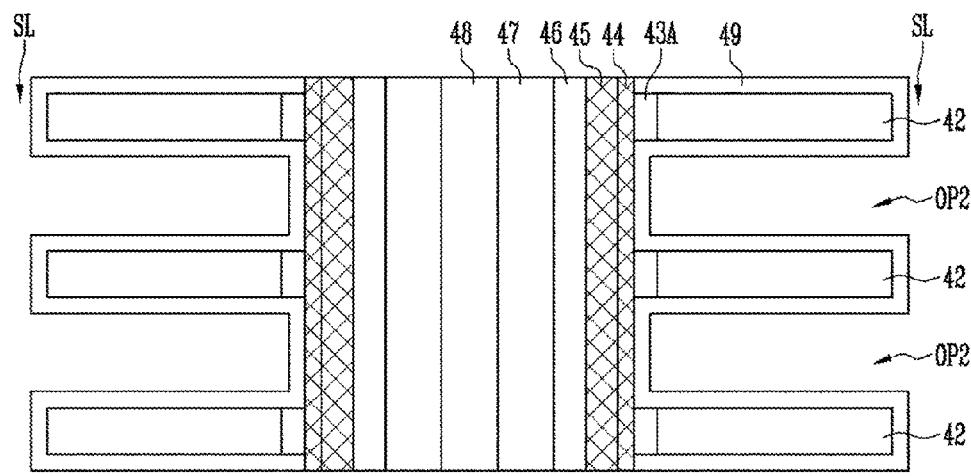
Figure 4C:
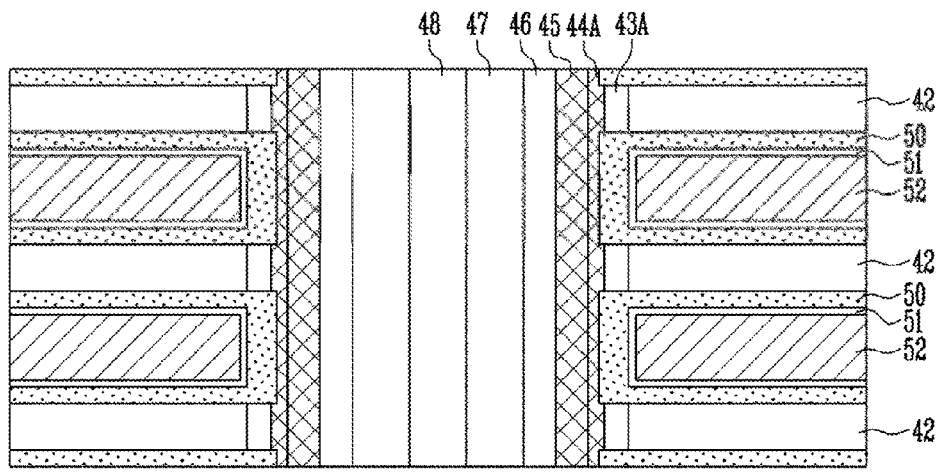

FIG. 4A to FIG. 4C are respectively cross-sectional views illustrating a method of manufacturing a semiconductor device according to one implementation of the present disclosure. In this embodiment, a silicon source layer may be formed in a first opening. Hereinafter, overlapping portions of descriptions for this embodiment with the previous descriptions may be omitted.

Referring to FIG. 4A, first material layers 41 and second material layers 42 may be alternately formed, and a first opening OP1 passing through the first and second material layers 41, and 42 may be formed. Sequentially, a sacrificial layer 43, first silicon source layer 44, data storage layer 45, tunnel insulating layer 46, channel layer 47 and gap-fill insulating layer 48 is formed in the first opening OP1. The first silicon source layer 44 may include a polysilicon, amorphous silicon, Si-rich nitride, N-rich nitride or stoichiometric nitride. Further, the first silicon source layer 44 may be thinner than a target first charge blocking layer. In one example, the thickness of the first silicon source layer 44 may be ½ or less than ½ as large as the charge blocking layer.

Referring to FIG. 4B, a slit SL passing through the first and second material layers 41 and 42 may be formed, and second openings OP2 may be formed by removing the first material layers 41. Next, the sacrificial layer 43 may be etched through the second openings OP2 to form sacrificial patterns 43A. At this time, the second material layers 42 may be partially etched through the second openings OP2.

Subsequently, a second silicon source layer 49 may be formed on the second material layers 42 and first silicon source layer 44 through the second openings OP2. The second silicon source layer 49 may include a polysilicon, amorphous silicon, Si-rich nitride, N-rich nitride or stoichiometric nitride. In other examples, formation of the second silicon source layer 49 may be omitted.

Referring to FIG. 4C, within the second openings OP2, first charge blocking patterns 50, second charge blocking patterns 51 and conductive patterns 52 may be formed. Subsequently, the first charge patterns 50 may be formed by oxidizing the first and second silicon source layers 44 and 49 (for example, see FIG. 4B). At this time, the first silicon source layer 44A may be selectively oxidized through the second openings OP2. Further, only a thickness portion of the first silicon source layer 44A exposed through each of the openings OP2 may be oxidized, allowing the first silicon source layer 44A to have an uneven outer face. Subsequently, the remaining first silicon source layer 44A may function as data storage together with the data storage layer 45.

Figure 5:
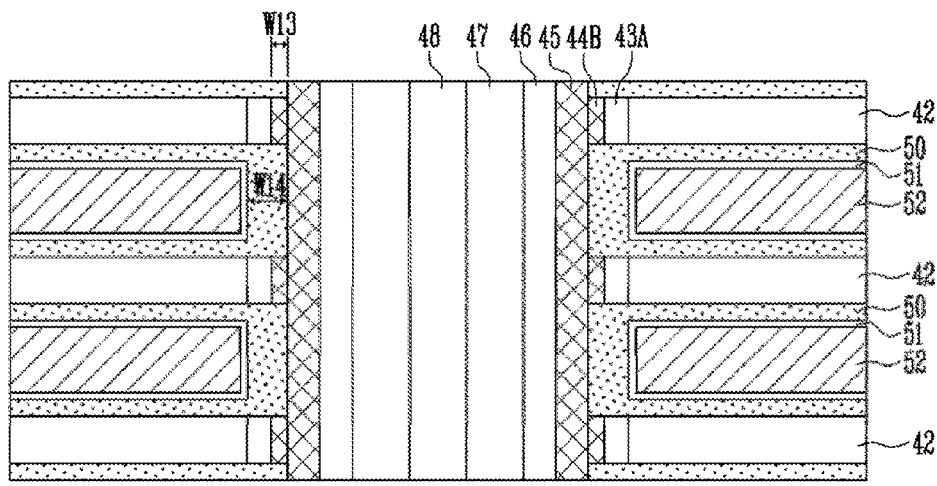
FIG. 5 is a cross-sectional view illustrating a configuration of and a method of manufacturing a semiconductor device according to one implementation of the present disclosure.

FIG. 5 is a cross-sectional view illustrating a configuration of and a method of manufacturing a semiconductor device according to one implementation of the present disclosure. In this embodiment, silicon source patterns may remain. Hereinafter, overlapping portions of descriptions for this embodiment with the previous descriptions may be omitted.

Referring to FIG. 5, in the oxidation, an entire thickness of exposed first silicon source layer 44 through each of the openings OP2 may be oxidized (for example, see FIG. 4B). That is, the silicon source patterns 44B may respectively remain only between the sacrificial patterns 43A and data storage layer 45. In this connection, each of the silicon source patterns 44B may have a thickness W13 less than a thickness W14 of the first charge blocking layer 50. The thickness W13 may be ½ or less than ½ as large as the thickness W14.

Figure 6:
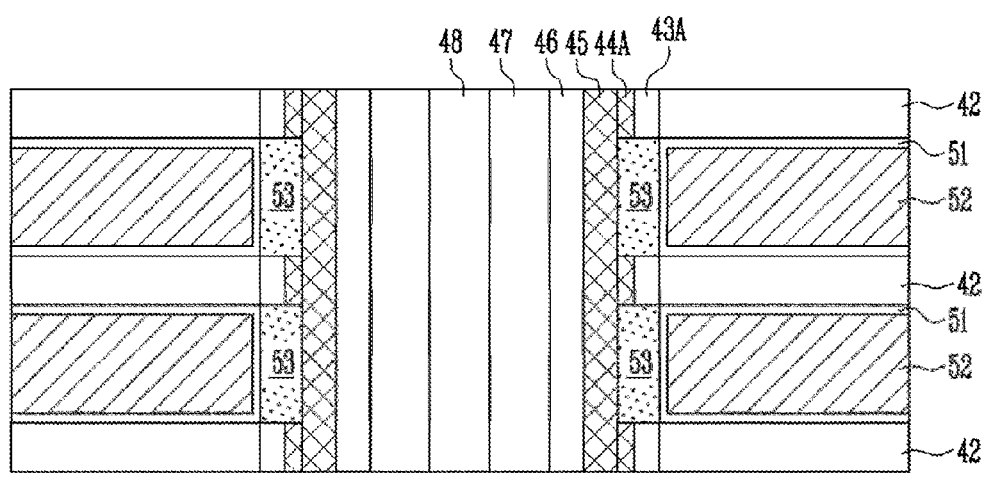
FIG. 6 is a cross-sectional view illustrating a configuration of and a method of manufacturing a semiconductor device according to one implementation of the present disclosure.

FIG. 6 is a cross-sectional view illustrating a configuration of and a method of manufacturing a semiconductor device according to one implementation of the present disclosure. In this embodiment, from among the first and second silicon source layers in FIG. 4A to FIG. 4C, only the first silicon source layer may be formed. Hereinafter, overlapping portions of descriptions for this embodiment with the previous descriptions may be omitted.

Referring to FIG. 6, through the second openings OP2, the first silicon source layer 44 (for example, see FIG. 4B) may be oxidized to form first charge blocking patterns 53. In this way, each of the first charge blocking patterns 53 may be formed in a ring shape to surround the data storage layer 45. The first charge blocking patterns 53 of the stacked memory cells may be spaced from each other. Further, the first charge blocking patterns 53 may be respectively formed only between the conductive patterns 52 and the data storage layer 45, whereas the first charge blocking patterns 53 may possibly not be formed between the conductive patterns 52 and insulating layers 42. As the first charge blocking patterns 53 are not formed between the conductive patterns 52 and insulating layers 42, a thickness of each of the conductive patterns 52 may be increased. Thus, this may lead to a corresponding resistance reduction of each of the gate electrodes.

Figure 7:
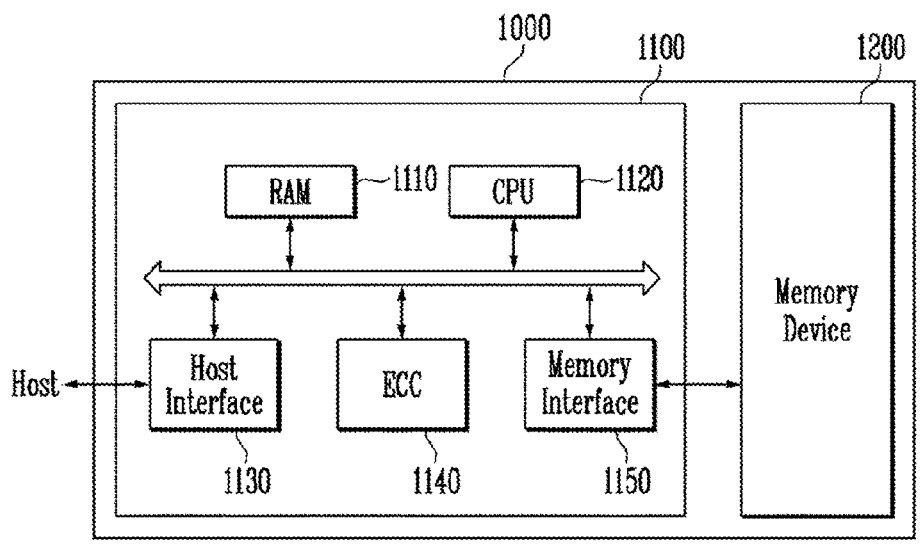
FIG. 7 is a block diagram of a memory system in accordance with one implementation of the present disclosure.

FIG. 7 is a block diagram of a memory system in accordance with one implementation of the present disclosure.

Referring to FIG. 7, a memory system 1000 in accordance with one implementation of the present disclosure may include a memory device 1200 and controller 1100.

The memory device 1200 may be used to store data information in various types such as a text, graphic, software code, etc. The memory device 1200 may be implemented in a nonvolatile memory, and may include the configurations as above-addressed in connection to FIG. 1 to FIG. 6. Further, the memory device 1200 may include conductive layers and insulating layers, alternately stacked, each of the insulating layers being thinner than each of the conductive layers; a channel layer passing through the conductive layers and the insulating layers; a data storage layer surrounding a sidewall of the channel layer; and first charge blocking patterns, each of the first charge blocking patterns interposed between the conductive layers and the insulating layers and between the data storage layer and the conductive layers. The memory device 1200 may have a same confirmation and manufacturing method thereof as in the above-addressed those.

The controller 1100 may be coupled to a host and the memory device 1200, and may be configured to access, in a response to a request from the host, the memory device 1200. For example, the controller 1100 may be configured to control reading, writing, erasing, background operations or the like of the memory device 1200.

The controller 1100 may include a RAM Random Access Memory 1110, CPU Central Processing Unit 1120, host interface 1130, ECC circuit Error Correction Code Circuit 1140, memory interface 1150 or the like.

In this connection, RAM 1110 may be employed as a work memory for the CPU 1120, as a cache memory between the memory device 1200 and host, as a buffer memory between the memory device 1200 and host and so on. It may be noted that the RAM 1110 may be replaced with SRAM Static Random Access Memory, ROM Read Only Memory, etc.

The CPU 1120 may be configured to control all of operations of the controller 1100. In one example, the CPU 1120 may be configured to operate firmware such as Flash Translation Layer FTL stored in the RAM 1110.

The host interface 1130 may interface with the host. In one example, the controller 1100 may communicate with the host over at least one of various interface protocols such as USB Universal Serial Bus protocol, MMC Multi-Media Card protocol, PCI Peripheral Component Interconnection protocol, PCI-E PCI-Express protocol, ATA Advanced Technology Attachment protocol, Serial-ATA protocol, Parallel-ATA protocol, SCSI Small Computer Small Interface protocol, ESDI Enhanced Small Disk Interface protocol, and IDE Integrated Drive Electronics protocol, private protocol, or the like.

The error correction code block 1140 may be configured to detect and correct an error in data received from the semiconductor memory device 1200 using an error correction code ECC.

The memory interface 1150 may interface with the semiconductor memory device 1200. For example, the memory interface may include a NAND interface or NOR interface.

It may be noted that the controller 1100 may further include a buffer memory not shown to temporarily store data. In this connection, the buffer memory may temporarily store data to be sent to an external device via the host interface 1130, or may temporarily store data to be sent from the memory device 1200 via the memory interface 1150. Further, one skilled in the art will note, as not shown in the figure, the controller 1100 of the memory system according to the present disclosure may be further provided with a ROM not shown to store code data to interface with the host system or host.

The memory system 1000 in accordance with one implementation of the present disclosure may include the memory device 1200 with data retention improvement, cell current enhancement and breakdown voltage establishment. This may allow for improved performance of the memory system 1000.

Figure 8:
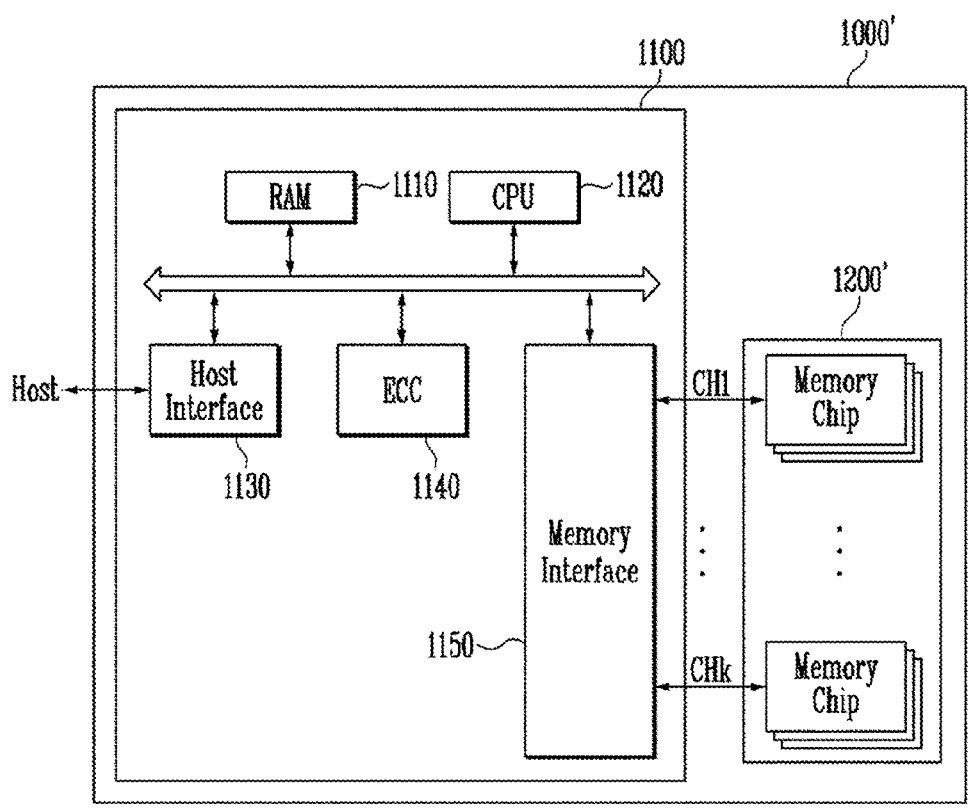
FIG. 8 is a block diagram of a memory system in accordance with one implementation of the present disclosure.

FIG. 8 is a block diagram of a memory system in accordance with one implementation of the present disclosure. Hereinafter, overlapping portions of descriptions for this embodiment with the previous descriptions may be omitted.

As shown in FIG. 8, the memory system 1000' in accordance with one implementation of the present disclosure may include a memory device 1200' and controller 1100. Further, the controller 1100 may include a RAM 1110, CPU 1120, host interface 1130, ECC circuit 1140, memory interface 1150 or the like.

The memory device 1200' may be used to store data information in various types such as a text, graphic, software code, etc. The memory device 1200' may be implemented in a nonvolatile memory, and may include the configurations as above-addressed in connection to FIG. 1 to FIG. 6. Further, the memory device 1200' may include conductive layers and insulating layers, alternately stacked, each of the insulating layers being thinner than each of the conductive layers; a channel layer passing through the conductive layers and the insulating layers; a data storage layer surrounding a sidewall of the channel layer; and first charge blocking patterns, each of the first charge blocking patterns interposed between the conductive layers and the insulating layers and between the data storage layer and the conductive layers. The memory device 1200' may have the same confirmation and manufacturing method thereof as in the above-addressed those.

Further, the memory device 1200' may be implemented in a multi-chips package composed of a plurality of memory chips. The plurality of memory chips may be divided into a plurality of groups. The plurality of groups may communicate respectively via first to k-th channels CH1 to CHk with the controller 1100. Each group may be configured to communicate via a single common channel with the controller 1100. The memory system 1000' may have a variation where a single channel may be assigned to a single memory chip.

The memory system 1000' in accordance with one implementation of the present disclosure may include the memory device 1200' with data retention improvement, cell current enhancement and breakdown voltage establishment. This may allow for improved performance of the memory system 1000'. Via the multi-chips package configuration of the memory device 1200', the memory system 1000' may have an increased data storage capacity, and a higher operation rate.

Figure 9:
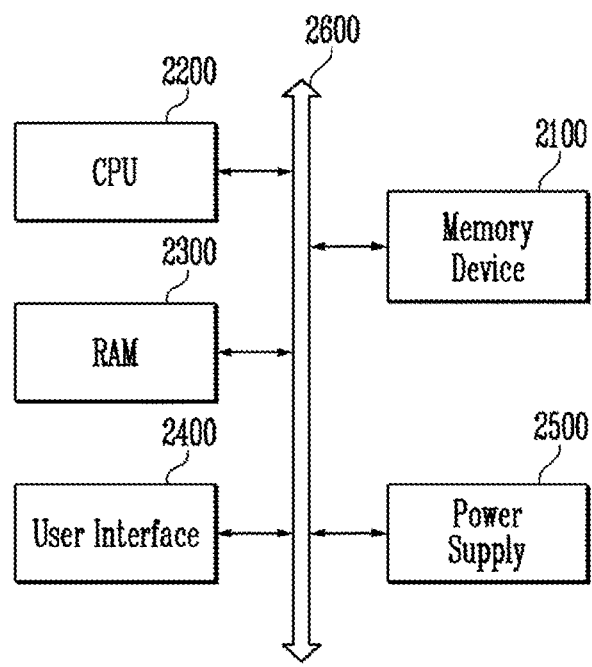
FIG. 9 is a block diagram of a computing system in accordance with one implementation of the present disclosure.

FIG. 9 is a block diagram of a computing system in accordance with one implementation of the present disclosure. Hereinafter, overlapping portions of descriptions for this embodiment with the previous descriptions may be omitted.

Referring to FIG. 9, a computing system 2000 in accordance with one implementation of the present disclosure may include a memory device 2100, CPU 2200, RAM 2300, user interface 2400, power-supply 2500, system bus 2600 or the like.

The memory device 2100 may store therein data supplied via the user interface 2400, and/or data processed by the CPU 2200 or/and the like. Further, the memory device 2100 may be electrically coupled, via the system bus 2600, to the CPU 2200, RAM 2300, user interface 2400, power-supply 2500, etc. In one example, the memory device 2100 may be coupled via the controller not shown to the system bus 2600, or may be directly coupled to the system bus 2600. When the memory device 2100 is directly connected to the system bus 2600, the function of the controller may be carried out by the CPU 2200, RAM 2300 etc.

The memory device 2100 may be implemented in a nonvolatile memory, and may include the configurations as above-addressed in connection to FIG. 1 to FIG. 6. Further, the memory device 2100 may include conductive layers and insulating layers, alternately stacked, each of the insulating layers being thinner than each of the conductive layers; a channel layer passing through the conductive layers and the insulating layers; a data storage layer surrounding a sidewall of the channel layer; and first charge blocking patterns, each of the first charge blocking patterns interposed between the conductive layers and the insulating layers and between the data storage layer and the conductive layers. The memory device 2100 may have the same confirmation and manufacturing method thereof as those in the above-addressed.

Further, the memory device 2100 may be implemented in a multi-chips package composed of a plurality of memory chips as in FIG. 8.

In one embodiment, the computing system 2000 may include a computer, UMPC Ultra Mobile PC, workstation, net-book, PDA Personal Digital Assistants, portable computer, web tablet, wireless phone, mobile phone, smart phone, e-book, PMP portable multimedia player, portable game player, navigation device, black box, digital camera, 3-dimensional television, digital audio recorder, digital audio player, digital picture recorder, digital picture player, digital video recorder, digital video player, a device with a wireless data communication, at least one electronic device as a home networking component, at least one electronic device as a computer networking component, at least one electronic device as a telematics networking component, a RIFD device, or the like.

The computing system 2000 in accordance with one implementation of the present disclosure may include the memory device 2100 with data retention improvement, cell current enhancement and breakdown voltage establishment. This may allow for improved performance of the computing system 2000. Via the multi-chips package configuration of the memory device 2100, the computing system 2000 may have an increased data storage capacity, and a higher operation rate.

Figure 10:
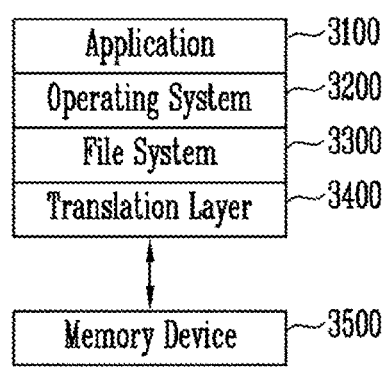
FIG. 10 is a block diagram of a computing system in accordance with one implementation of the present disclosure.

FIG. 10 is a block diagram of a computing system in accordance with one implementation of the present disclosure.

Referring to FIG. 10, a computing system 3000 in accordance with one implementation of the present disclosure may include a software layer such as an application 3100, operating system 3200, file system 3300, a translation layer 3400 or the like. Further, the computing system 3000 may include a hardware layer such as a memory device 3500, etc.

The operating system 3200 may be configured to manage software and/or hardware resources or the like of the computing system 3000 and may control a program execution via a CPU central processing unit. The application 3100 may be implemented in various application programs executed on the computing system 3000, including utilities executed by the operating system 3200.

The file system 3300 may refer to a logical structure to manage data, file or the like present in the computing system 3000 and may organize file or data to be stored in the memory device 3500, etc. based on rules. The file system 3300 may be determined depending on the operating system 3200 running on the computing system 3000. In one example, when the operating system 3200 is implemented in Windows series by Microsoft Corporation, the file system 3300 may include FAT File Allocation Table, NTFS NT file system etc. Otherwise, when the operating system 3200 is implemented in Unix/Linux series, the file system 3300 may include an EXT extended file system, UFS Unix File System, JFS Journaling File System etc.

Although the operating system 3200, application 3100 and file system 3300 are shown in individual blocks respectively in this figure, the application 3100 and file system 3300 may be incorporated in the operating system 3200.

The translation layer 3400 may translate an address into a format complying with the memory device 3500 in a response to a request from the file system 3300. In one example, the translation layer 3400 may translate a logical address generated from the file system 3300 to a physical address of the memory device 3500. In this connection, mappings between the logical address and physical address may be stored in an address translation table. In one example, the translation layer 3400 may be implemented in a Flash Translation Layer FTL, Universal Flash Storage Link Layer ULL, or the like.

The memory device 3500 may be implemented in a nonvolatile memory, and may include the configurations as above-addressed in connection to FIG. 1 to FIG. 6. Further, the memory device 3500 may include conductive layers and insulating layers, alternately stacked, each of the insulating layers being thinner than each of the conductive layers; a channel layer passing through the conductive layers and the insulating layers; a data storage layer surrounding a side-wall of the channel layer; and first charge blocking patterns, each of the first charge blocking patterns interposed between the conductive layers and the insulating layers and between the data storage layer and the conductive layers. The memory device 3500 may have the same confirmation and manufacturing method thereof as in the above-addressed those.

The computing system 3000 may be divided into an operation system layer corresponding to an upper level region and a controller layer corresponding to a lower level region. In this connection, the application 3100, operating system 3200 and file system 3300 may be defined in the operating system layer, and may be associated with a work memory for the computing system 3000. Further, the translation layer 3400 may be defined in either the operating system layer or the controller layer.

The computing system 3000 in accordance with one implementation of the present disclosure may include the memory device 3500 with data retention improvement, cell current enhancement and breakdown voltage establishment. This may allow for improved performance of the computing system 3000. Via the multi-chips package configuration of the memory device 3500, the computing system 3000 may have an increased data storage capacity, and a higher operation rate.

The above description is not to be taken in a limiting sense, but is made merely for the purpose of describing the general principles of exemplary embodiments, and many additional embodiments of this disclosure are possible. It is understood that no limitation of the scope of the disclosure is thereby intended. The scope of the disclosure should be determined with reference to the Claims. Reference throughout this specification to "one embodiment," "an embodiment," or similar language means that a particular feature, structure, or characteristic that is described in connection with the embodiment is included in at least one embodiment of the present disclosure. Thus, appearances of the phrases "in one embodiment," "in an embodiment," and similar language throughout this specification may, but do not necessarily, all refer to the same embodiment.

What is claimed is:

1. A semiconductor device comprising:
   conductive layers and insulating layers, alternately stacked, each of the insulating layers being thinner than each of the conductive layers;
   a channel layer passing through the conductive layers and the insulating layers;
   a data storage layer surrounding a side-wall of the channel layer;
   first charge blocking patterns, each of the first charge blocking patterns interposed between the conductive layers and the insulating layers and interposed between the data storage layer and the conductive layers; and
   silicon source patterns, each of the source patterns interposed between the data storage layer and each of the insulating layers, wherein each of the silicon source patterns includes a higher silicon content than the data storage layer.

2. The device of claim 1, further comprising:
oxide patterns, each of the oxide patterns interposed between the data storage layer and each of the insulating layers.

3. The device of claim 1, wherein a thickness of each of the silicon source patterns is less than a thickness of each of the first charge blocking patterns.

4. The device of claim 1, wherein each of the first charge blocking patterns includes a first portion contacting the insulating layers and a second portion contacting the data storage layer, and the second portion is thicker than the first portion.

5. The device of claim 1, wherein the data storage layer includes first portions contacting the first charge blocking patterns and second portions disposed between adjacent the first portions, and the first portions is thinner than the second portions.

6. The device of claim 1, further comprising:
second charge blocking patterns, each of the second charge blocking patterns being disposed between each of the conductive layers and each of the first charge blocking patterns.

7. The device of claim 1, wherein the data storage layer includes:
a first nitride layer surrounding the side-wall of the channel layer, the first nitride layer containing a silicon; and
a second nitride layer between the first nitride layer and the channel layer, the second layer containing a silicon, wherein the second layer has a lower silicon content than the first nitride layer.

8. The device of claim 7, wherein the first nitride layer is thinner than the second nitride layer.

9. The device of claim 7, wherein the first nitride layer has an uneven outer surface.

* * * * *